United States Patent
Chen et al.

(10) Patent No.: US 10,557,866 B2
(45) Date of Patent: Feb. 11, 2020

(54) PROBE SEAT OF VERTICAL PROBE DEVICE

(71) Applicant: MPI CORPORATION, Chu-Pei, Hsinchu Shien (TW)

(72) Inventors: Tsung-Yi Chen, Chu-Pei (TW); Shih-Shin Chen, Chu-Pei (TW)

(73) Assignee: MPI CORPORATION, Chu-Pei, Hsinchu Shien (TW)

(*) Notice: Subject to any disclaimer, the term of this patent is extended or adjusted under 35 U.S.C. 154(b) by 262 days.

(21) Appl. No.: 15/363,659

(22) Filed: Nov. 29, 2016

(65) Prior Publication Data

US 2017/0153271 A1 Jun. 1, 2017

(30) Foreign Application Priority Data

Dec. 1, 2015 (TW) .............................. 104140230 A

(51) Int. Cl.
*G01R 1/073* (2006.01)
*G01R 1/04* (2006.01)

(52) U.S. Cl.
CPC ........... *G01R 1/04* (2013.01); *G01R 1/07314* (2013.01); *G01R 1/07371* (2013.01)

(58) Field of Classification Search
None
See application file for complete search history.

(56) References Cited

U.S. PATENT DOCUMENTS

| 7,242,203 | B2* | 7/2007 | LaMeres | ............ | G01R 31/2818 |
| | | | | | 324/750.25 |
| 2002/0155735 | A1* | 10/2002 | Zhou | ................. | G01R 1/06711 |
| | | | | | 439/66 |
| 2009/0219043 | A1* | 9/2009 | Nakayama | ......... | G01R 31/2889 |
| | | | | | 324/762.05 |
| 2011/0128028 | A1* | 6/2011 | Lin | .......................... | G01R 3/00 |
| | | | | | 324/756.03 |
| 2012/0025859 | A1* | 2/2012 | Huang | ............... | G01R 1/07342 |
| | | | | | 324/755.01 |

FOREIGN PATENT DOCUMENTS

| JP | 2011145279 A | 7/2011 |
| TW | 201137357 A | 11/2011 |
| TW | 201537181 | 10/2015 |

OTHER PUBLICATIONS

Kiyofuji Hidehero et al. ; Probe card and inspection device; Jul. 28, 2011; Micronics Japan Co Ltd.; JP 2011145279 A; G01R1/073.*

* cited by examiner

*Primary Examiner* — Nasima Monsur
(74) *Attorney, Agent, or Firm* — Muncy, Geissler, Olds & Lowe, P.C.

(57) ABSTRACT

A probe seat of a vertical probe device includes a lower die, a middle die fixed on the lower die, at least one upper die fixed on the middle die, and at least one reinforcing die fixedly disposed in at least one through trough of the middle die. The lower die has lower probe holes located below the through trough, such that probes are be inserted through the lower probe holes respectively and inserted through the through trough. The at least one upper die has upper probe holes located above the through trough for the probes to be inserted therethrough. The at least one reinforcing die has middle probe holes for the probes to be inserted therethrough. As a result, the probe seat has improved rigidity to avoid bending.

6 Claims, 7 Drawing Sheets

PROBE SEAT OF VERTICAL PROBE DEVICE

BACKGROUND OF THE INVENTION

1. Field of the Invention

The present invention relates generally to a probe device of a probe card and more particularly, to a probe seat of a vertical probe device.

2. Description of the Related Art

Upon testing semiconductor chips, a testing equipment is electrically connected with devices under test (hereinafter referred to as the "DUTs") through a probe card, so that the testing equipment can obtain the testing results of the DUTs by means of signal transmission and analysis. The conventional probe card is usually composed of a circuit board and a probe device, or further includes a space transformer disposed between the circuit board and the probe device. The conventional vertical probe device usually includes a probe seat, and a plurality of vertical probes penetrating through the probe seat in substantially vertical posture. The vertical probes, such as pogo pins, are arranged corresponding in positions to contact pads of the DUTs, so that the contact pads can be probed by the vertical probes at the same time.

The aforesaid probe seat of the vertical probe device usually includes upper, middle and lower dies piled on one another in order. Each of the upper and lower dies has a plurality of probe holes. The middle die is disposed between the upper and lower dies and has a hollow configuration; this means the middle die is provided at the center thereof with a through trough. The probe holes of the upper die communicate with the probe holes of the lower die through the through trough. Each of the vertical probes is inserted through the probe hole of the upper die, the through trough of the middle die and the probe hole of the lower die, and has a bottom end extending out of the lower die for probing the contact pad of the DUT.

If the DUT has numerous contact pads crowded together, the probe device should be correspondingly provided with numerous probes crowded together as well. In particular, if the probe device is a multi-DUT probe head capable of testing a plurality of DUTs at the same time, it has even more probes. However, the hollow-shaped middle die brings the probe seat relatively lower rigidity and provides space enabling the upper and lower dies to be deformed elastically. Therefore, when the numerous probes disposed in the probe seat do the probing action at the same time, the reaction force is liable to bend the probe seat. Especially for the probe seat of the multi-DUT probe head, the dies thereof are large, and the through trough of the middle die thereof is also large. Besides, the multi-DUT probe head receives a relatively larger reaction force because of having relatively more probes. Therefore, the probe seat of the multi-DUT probe head is relatively more liable to be bent.

SUMMARY OF THE INVENTION

The present invention has been accomplished in view of the above-noted circumstances. It is an objective of the present invention to provide a probe seat of a vertical probe device, which has improved rigidity so as to avoid bending thereof.

To attain the above objective, the present invention provides a probe seat of a vertical probe device, which includes a lower die, a middle die fixed on the lower die, at least one upper die fixed on the middle die, and at least one reinforcing die. The lower die has a plurality of lower probe holes for a plurality of probes to be respectively inserted therethrough. The middle die has at least one through trough for the probes to be inserted therethrough. Each of the lower probe holes of the lower die is located below the through trough of the middle die. The at least one upper die has a plurality of upper probe holes. Each of the upper probe holes is located above the through trough of the middle die for the probes to be respectively inserted therethrough. The at least one reinforcing die is fixedly disposed in the at least one through trough and has a plurality of middle probe holes for the probes to be respectively inserted therethrough.

As a result, because of having the at least one reinforcing die, the probe seat of the present invention has improved rigidity so as to avoid bending thereof. In particular, the at least one reinforcing die may be configured having a shape in substantial complement with the shape of the at least one through trough for bringing the probe seat relatively higher rigidity. For the way of fixedly disposing the at least one reinforcing die in the at least one through trough, a way of fixing the at least one reinforcing die on the lower die by means of at least one screw may, but not limited to, be used.

Preferably, at least one side of the through trough of the middle die may be protruded with a reinforcing block. The reinforcing block of the middle die may be fixed on the lower die by means of at least one screw. In this way, the reinforcing block can further increase the rigidity of the probe seat. More preferably, the through trough of the middle die may have two reinforcing blocks opposite to each other; this means two opposite sides of the through trough each are protruded with one reinforcing block; in this way, the probe seat has even higher rigidity.

Preferably, the lower die may have a plurality of protrusions located in the through trough of the middle die; the at least one reinforcing die is fixed on the protrusions by means of screws. More preferably, the protrusions may include two side protrusions located at two opposite sides of the through trough of the middle die respectively. Besides, two opposite sides of the through trough of the middle die may be protruded with two reinforcing blocks respectively, and the protrusions may include a middle protrusion located between the two reinforcing blocks. In this way, the protrusions can further increase the rigidity of the probe seat, and have the function of positioning the middle die on the lower die. Besides, the middle protrusion has a supporting function at the center of the through trough having a wide span, thereby bringing the probe seat relatively higher rigidity.

Preferably, the probe seat may have a plurality of detection areas, each of which is arranged corresponding in position to a device under test; the aforesaid reinforcing blocks and the middle protrusion may be located between two adjacent detection areas. In other words, the probe seat may serve as a multi-DUT probe head; in such condition, the aforesaid reinforcing die, reinforcing block and protrusion are also effective in increasing the rigidity of the probe seat, and the aforesaid reinforcing blocks and the middle protrusion have a supporting function to a place between two adjacent detection areas which are quite distanced from each other, thereby further increasing the rigidity of the probe seat.

Preferably, the probe seat may have a plurality of probe installation areas, each of which has an upper die, a reinforcing die and a through trough; the lower die and the middle die are shared by the probe installation areas. In other words, the probe seat can be the combination of multiple upper dies and multiple reinforcing dies with a single middle die and a single lower die; such arrangement is also effective in increasing the rigidity of the probe seat.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention, and wherein.

DETAILED DESCRIPTION OF THE INVENTION

Figure 1:
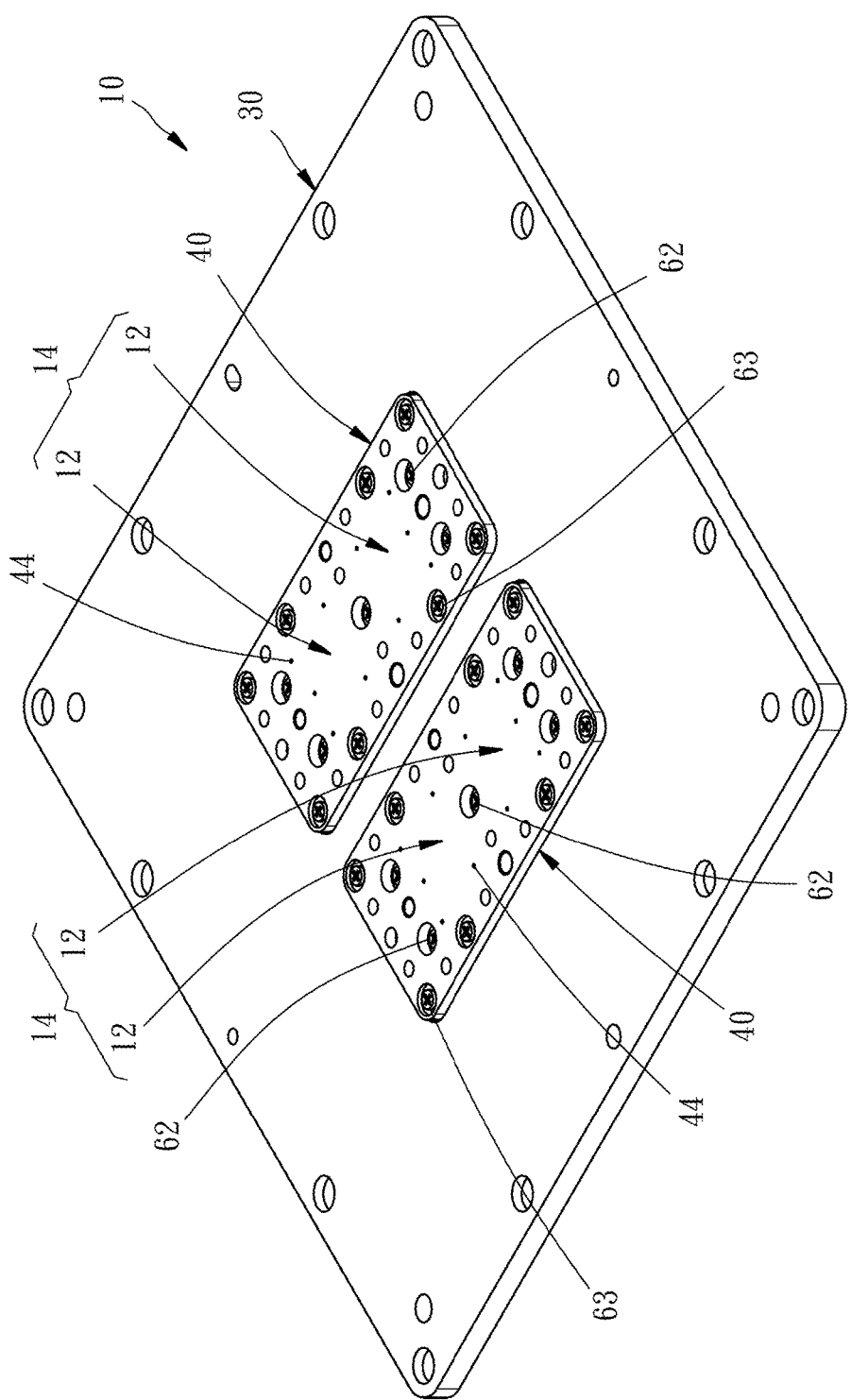
FIG. 1 is an assembled perspective view of a probe seat of a vertical probe device according to a preferred embodiment of the present invention.

Referring to FIGS. 1-8, a probe seat 10 of a vertical probe device according to a preferred embodiment of the present invention primarily includes a lower die 20, a middle die 30, two upper dies 40, and two reinforcing dies 50.

In this embodiment, the probe seat 10 is adapted for being used in a multi-DUT probe head for testing a plurality of DUTs at the same time. Specifically speaking, the probe seat 10 has four detection areas 12 as shown in FIG. 1. Each of the detection areas 12 is arranged corresponding in position to a DUT (not shown). When the detection areas 12 of the probe seat 10 are all equipped with probes (not shown), the probe device with such probe seat and probes is capable of testing four DUTs at the same time. However, the probe seat of the present invention is not limited to be the one adapted for testing a plurality of DUTs at the same time, as shown in this embodiment. In other words, the probe seat of the present invention may have only one detection area.

Figure 2:
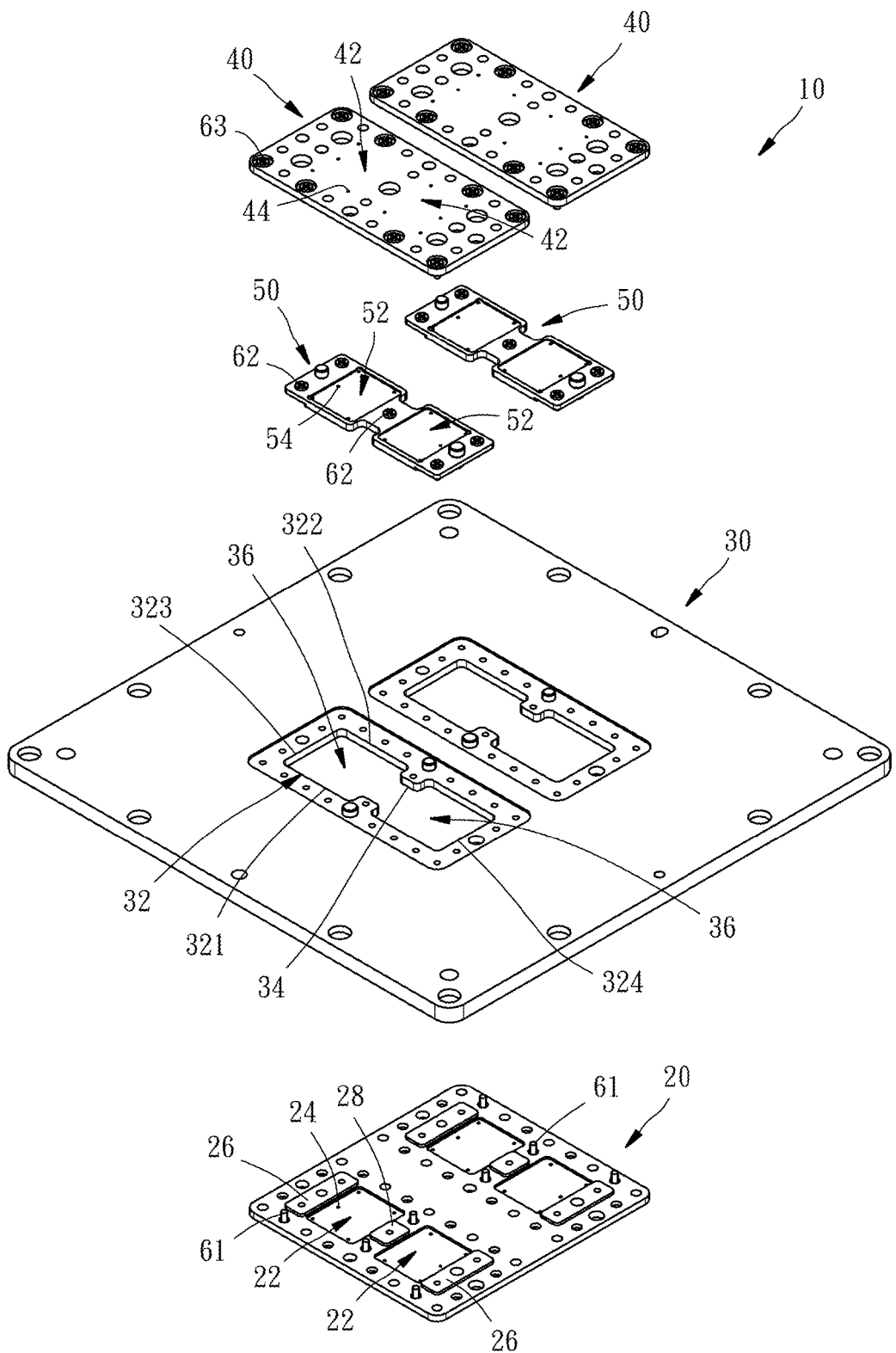
FIG. 2 is an exploded perspective view of the probe seat of the vertical probe device according to the preferred embodiment of the present invention.

As shown in FIG. 2, the middle die 30 has a hollow configuration with two through troughs 32. Two opposite sides 321 and 322 of each through trough 32 are protruded with two reinforcing blocks 34 respectively. The reinforcing blocks 34 divide each through trough 32 having a wide span into two probe accommodating areas 36 communicating with each other. The two reinforcing dies 50 are each configured having a shape in substantial complement with the shape of associated through trough 32. Specifically speaking, the external contour of each reinforcing die 50 is shaped approximately the same with the internal contour of each through trough 32, but each reinforcing die 50 has a size a little smaller than the size of each through trough 32.

Figure 3:
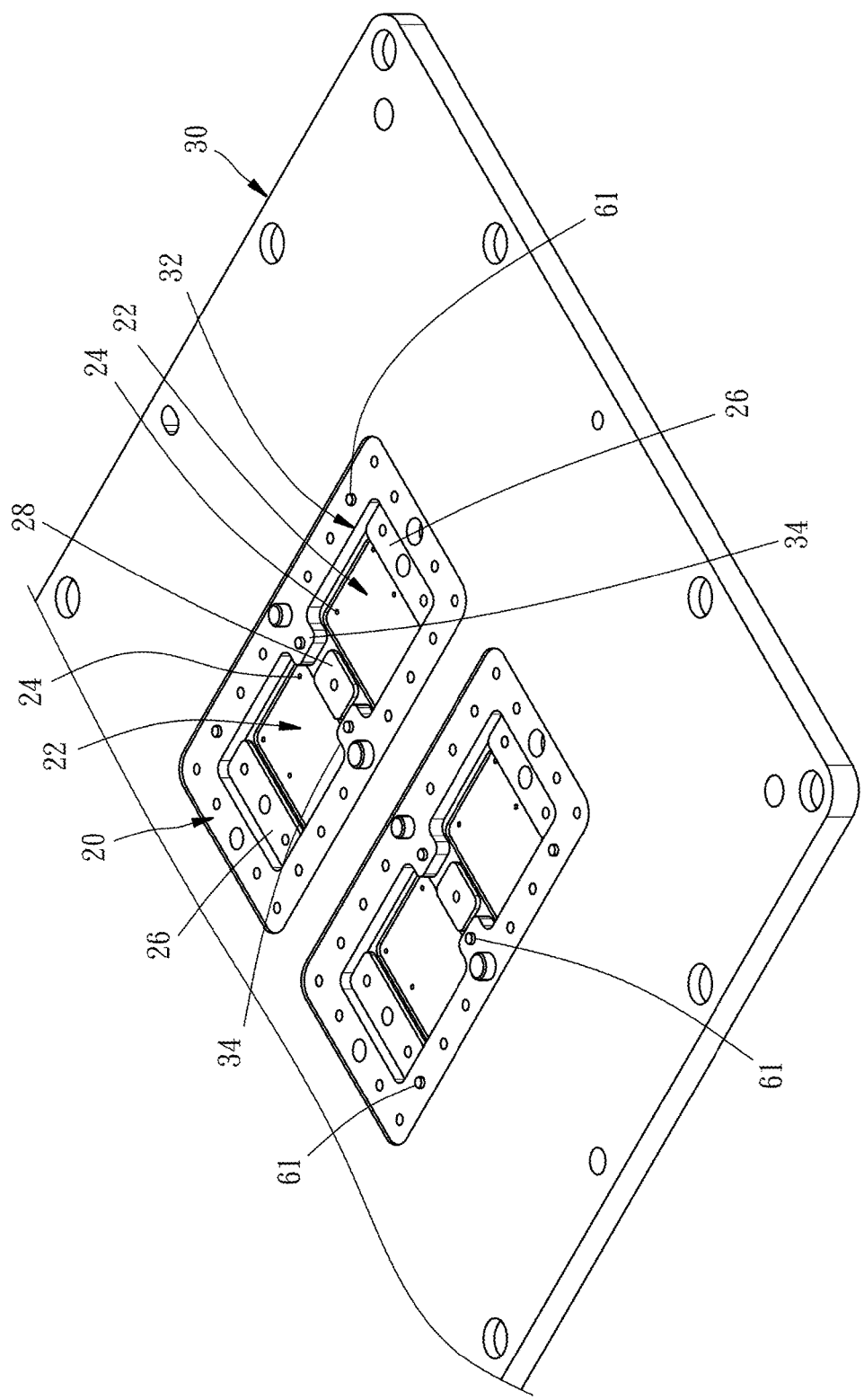
FIG. 3 is an assembled perspective view showing that a lower die and a middle die of the probe seat of the vertical probe device according to the preferred embodiment of the present invention are combined together.
Figure 6:
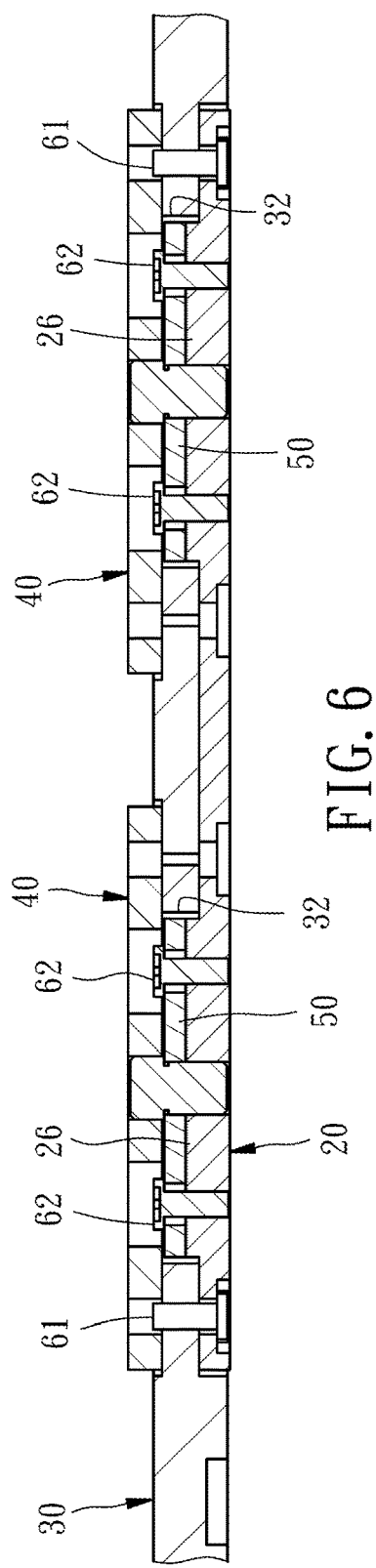
FIGS. 6-8 are sectional views taken along the lines 6-6, 7-7 and 8-8 in FIG. 5, respectively.
Figure 7:
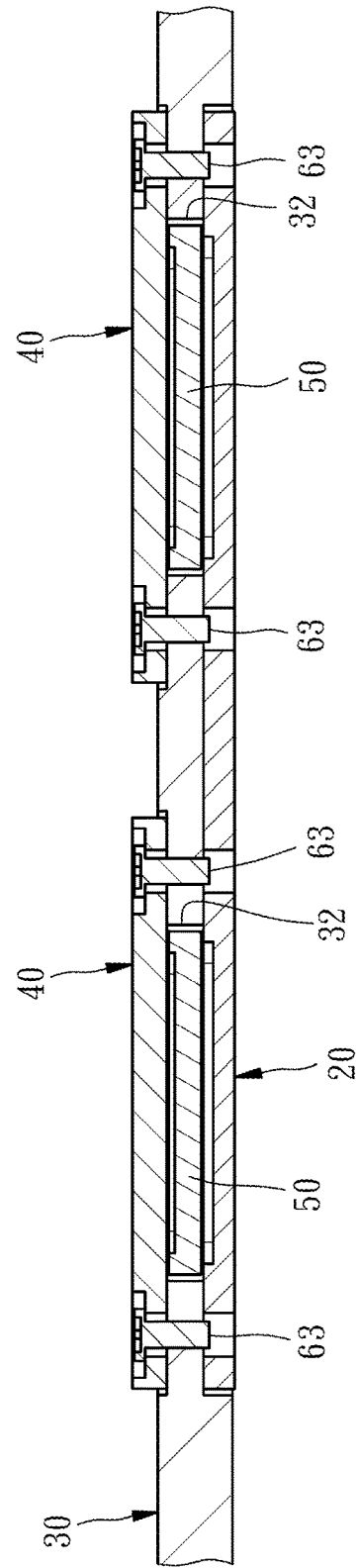
Figure 8:
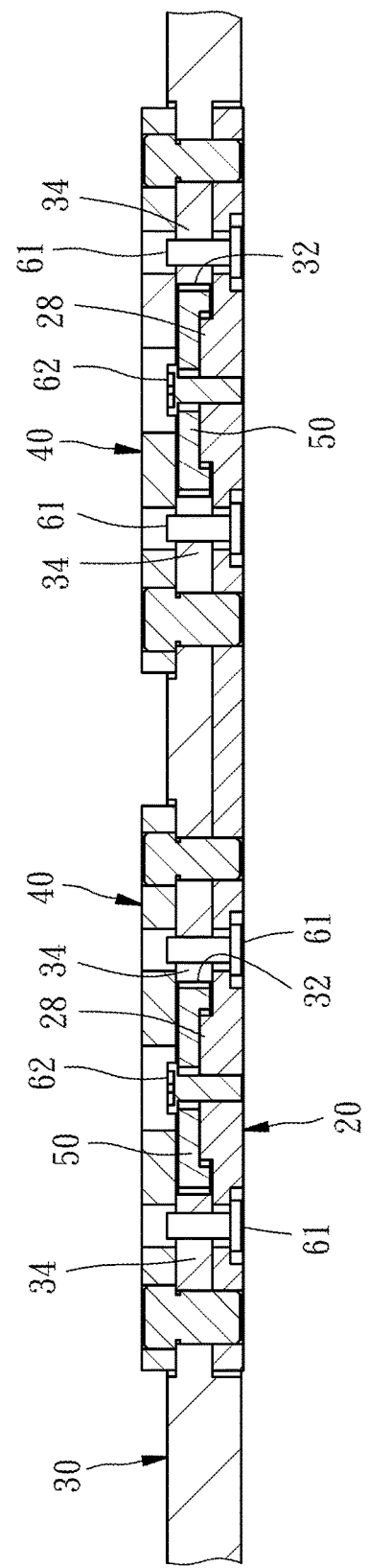

As shown in FIG. 3, the middle die 30 is fixed on the lower die 20 by means of eight screws 61, and four of the screws 61 are used to fix the four reinforcing blocks 34 on the lower die 20 respectively. Each of the screws 61 is inserted through the lower die 20 from the bottom to the top of the lower die 20 and screwed into the middle die 30, as shown in FIGS. 6-8. The lower die 20 has four probe insertion areas 22 corresponding in position to the probe accommodating areas 36 respectively. Each of the probe insertion areas 22 is provided with a plurality of lower probe holes 24. Each of the lower probe holes 24 is located below the associated probe accommodating area 36. Therefore, a plurality of probes (not shown) can be inserted through the lower probe holes 24, respectively. These probes are also inserted through the through trough 32 of the middle die 30.

Figure 4:
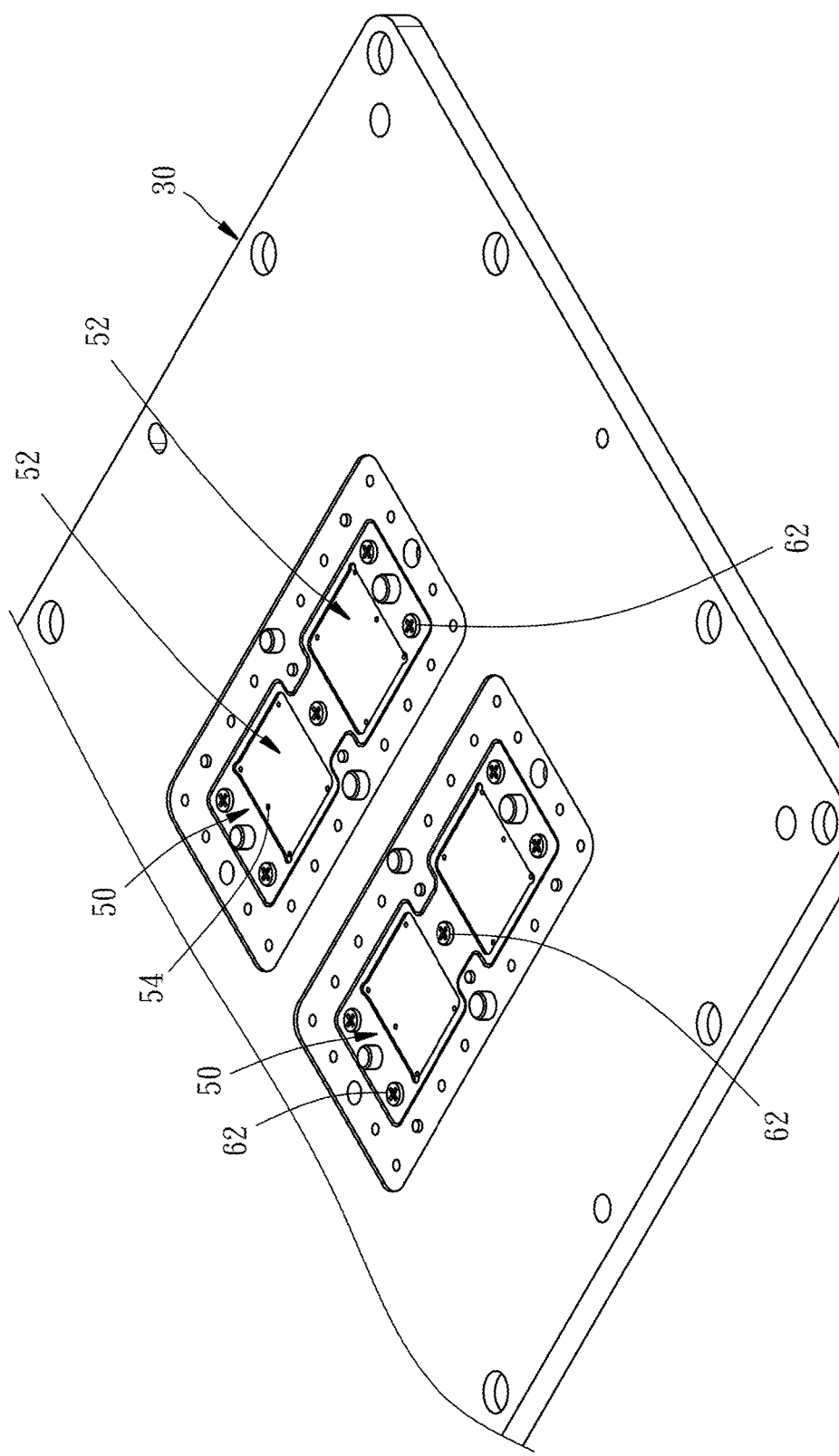
FIG. 4 is an assembled perspective view showing that the lower die, the middle die and two reinforcing dies of the probe seat of the vertical probe device according to the preferred embodiment of the present invention are combined together.

As shown in FIG. 4, each of the two reinforcing dies 50 is fixed on the lower die 20 by means of five screws 62, and the two reinforcing dies 50 are disposed in the two through troughs 32, respectively. Each of the screws 62 is inserted through the reinforcing die 50 from the top to the bottom of the reinforcing die 50 and screwed into the lower die 20, as shown in FIGS. 6-8. Each reinforcing die 50 is not limited to be fixed on the lower die 20, as long as each reinforcing die 50 is fixedly disposed in the through trough 32. Each of the two reinforcing dies 50 has two probe insertion areas 52, and the probe insertion areas 52 are located in the probe accommodating areas 36, respectively. Each of the probe insertion areas 52 is provided with a plurality of middle probe holes 54 for the aforesaid a plurality of probes to be inserted through the middle probe holes 54 respectively.

As shown in FIG. 1, the probe seat 10 in this embodiment is defined with two probe installation areas 14, each of which has two detection areas 12, an upper die 40, a reinforcing die 50 and a through trough 21. The lower die 20 and the middle die 30 are shared by the two probe installation areas 14.

In this embodiment, the lower die 20 has four protrusions 26 and two protrusions 28, and there are two protrusions 26 and one protrusion 28 located in each of the two probe installation areas 14, as shown in FIG. 3. Each of the protrusions 26 and 28 may be a sheet fixed on a base of the lower die 20 by screws, or formed with the base of the lower die 20 integrally as shown in FIGS. 6-8. The three protrusions 26 and 28 located in the same probe installation area 14 include two side protrusions 26 with larger area and a middle protrusion 28 with smaller area. The protrusions 26 and 28 are located in the through troughs 32 of the middle die 30. In each of the through trough 32, the middle protrusion 28 is located between the protruding reinforcing blocks 34 of the aforesaid two opposite sides 321 and 322, the two side protrusions 26 are located adjacent to the other two opposite sides 323 and 324 respectively, and the reinforcing die 50 is fixed on the protrusions 26 and 28.

Figure 5:
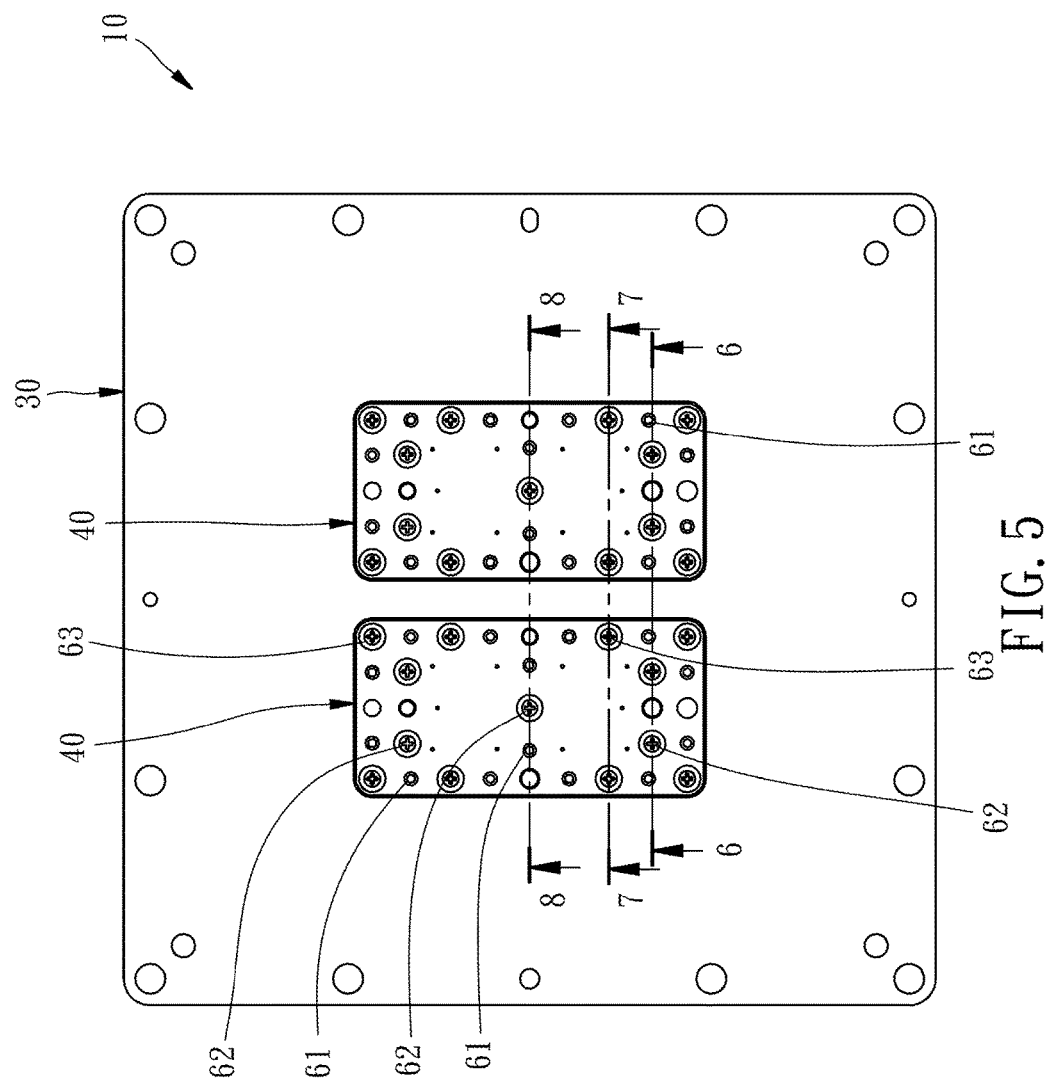
FIG. 5 is a top view of the probe seat of the vertical probe device according to the preferred embodiment of the present invention.

As shown in FIGS. 5-7, each of the two upper dies 40 is fixed on the middle die 30 by means of eight screws 63. Each of the screws 63 is inserted through the upper die 40 from the top to the bottom of the upper die 40 and screwed into the middle die 30. As shown in FIG. 2, each of the two upper dies 40 has two probe insertion areas 42, and the probe insertion areas 42 correspond in position to the probe accommodating areas 36 respectively. Each of the probe insertion areas 42 is provided with a plurality of upper probe holes 44. Each of the upper probe holes 44 is located above the associated probe accommodating area 36 for the aforesaid a plurality of probes to be inserted through the upper probe holes 44 respectively.

In other words, each probe is inserted through an upper probe hole 44, a middle probe hole 54, and a lower probe hole 24 in such a way that each probe extends through a through trough 32 that is disposed with a reinforcing die 50 therein. It is to be mentioned that there are actually a big number of probes (about 1000-5000 probes) installed in each detection area 12. That is, each of the probe insertion areas 22, 42 and 52 is actually provided crowdedly with many tiny-sized probe holes 24, 44, and 54 in an amount same as the amount of the probes. However, for simplifying the figures and showing the probe holes clearly, the figures in this embodiment show only five probe holes 24, 44 and 54 in each of the probe insertion areas 22, 42 and 52, and each of the probe holes 24, 44 and 54 is not drawn according to the actual size thereof.

Because of having the reinforcing dies 50, the aforesaid probe seat 10 has improved rigidity. Therefore, when the numerous probes inserted in the probe seat 10 probe the DUTs at the same time, thereby causing that the probe seat 10 receives a very large reaction force, the bending of the probe seat 10 can still be avoided. In particular, the reinforcing dies 50 may, but not limited to, be configured having a shape in substantial complement with the shape of the through troughs 32 for bringing the probe seat even higher rigidity. Besides, the aforesaid reinforcing blocks 34 located at the sides of the through troughs 32 of the middle die 30 and the protrusions 26 and 28 of the lower die 20 are all effective in increasing the rigidity of the probe seat 10. The protrusions 26 and 28 further have the function of positioning the middle die 30 on the lower die 20. In addition, each through trough 32 may be configured with the capacity of accommodating a plurality of reinforcing dies 50 piled on one another, so that the amount of the reinforcing die 50 disposed in each through trough 32 can be adjusted according to the length of the probe.

In the condition that the probe seat 10 is adapted for being used in the multi-DUT probe head and thereby having a plurality of detection areas 12, it will be a simple and optimal structural design that a single through trough 32 is shared by at least two detection areas 12. The adjacent detection areas 12 need a proper distance therebetween, so each through trough 32 should be configured having a wide span. The aforesaid reinforcing blocks 34 and middle protrusion 28 are located between two adjacent detection areas 12, thereby having a supporting function at the center of the through trough 32 and the center of the reinforcing die 50. Therefore, the reinforcing blocks 34 and the middle protrusions 28 have the supporting function to a place between the adjacent detection areas 12 in the same probe installation area 14, thereby increasing the rigidity of the probe seat.

Furthermore, the probe seat of the present invention can, but not limited to, be a combination of multiple upper dies and multiple reinforcing dies with a single middle die and a single lower die, such as the probe seat 10 in this embodiment, which is combinedly formed of two upper dies 40 and two reinforcing dies 50 with a single middle die 30 and a single lower die 20. Such arrangement is also effective in increasing the rigidity of the probe seat.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A probe seat of a vertical probe device, the probe seat comprising:
   a lower die having a plurality of lower probe holes for a plurality of probes to be respectively inserted therethrough;
   a middle die fixed on the lower die and having at least one through trough for the plurality of probes to be inserted therethrough, each of the lower probe holes being located below the through trough of the middle die;
   at least one upper die fixed on the middle die and having a plurality of upper probe holes located above the through trough of the middle die for the plurality of probes to be respectively inserted therethrough; and
   at least one reinforcing die fixedly disposed in said at least one through trough and having a plurality of middle probe holes for the probes to be respectively inserted therethrough;
   wherein said at least one reinforcing die is fixed on the lower die by at least one screw;
   wherein the lower die has a plurality of protrusions located in the through trough of the middle die; said at least one reinforcing die is fixed on the protrusions of the lower die by said at least one screw.

2. The probe seat of the vertical probe device as claimed in claim 1, wherein the protrusions comprise two side protrusions located at two opposite sides of the through trough of the middle die, respectively.

3. The probe seat of the vertical probe device as claimed in claim 1, wherein two opposite sides of the through trough of the middle die are protruded with two reinforcing blocks, respectively; the protrusions comprise a middle protrusion located between said two reinforcing blocks; the probe seat has a plurality of detection areas, each of which is arranged corresponding in position to a device under test; said two reinforcing blocks and the middle protrusion are located between two adjacent said detection areas.

4. The probe seat of the vertical probe device as claimed in claim 1, comprising a plurality of probe installation areas, each of which comprises one said upper die, one said reinforcing die and one said through trough; the lower die and the middle die are shared by the probe installation areas.

5. The probe seat of the vertical probe device as claimed in claim 1, comprising a plurality of detection areas, each of which is arranged corresponding in position to a device under test; at least one side of the through trough of the middle die is protruded with a reinforcing block that is located between two adjacent said detection areas.

6. The probe seat of the vertical probe device as claimed in claim 1, wherein said at least one reinforcing die is configured having a shape in substantial complement with a shape of said at least one through trough.

* * * * *